(12) United States Patent
Zhou et al.

(10) Patent No.: US 10,829,244 B2
(45) Date of Patent: Nov. 10, 2020

(54) LED LIGHTING DEVICES WITH HIGH EXTRACTION EFFICIENCIES

(71) Applicant: HONEYWELL INTERNATIONAL INC., Morris Plains, NJ (US)

(72) Inventors: Jianhua Zhou, Shanghai (CN); Rui Tong, Shanghai (CN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 15/891,543

(22) Filed: Feb. 8, 2018

(65) Prior Publication Data

US 2019/0241277 A1 Aug. 8, 2019

(51) Int. Cl.
| | |
|---|---|
| *B64D 47/02* | (2006.01) |
| *F21K 9/68* | (2016.01) |
| *B60Q 3/40* | (2017.01) |
| *H01L 33/60* | (2010.01) |
| *F21Y 115/10* | (2016.01) |
| *F21W 107/30* | (2018.01) |

(52) U.S. Cl.
CPC ............... *B64D 47/02* (2013.01); *B60Q 3/40* (2017.02); *F21K 9/68* (2016.08); *H01L 33/60* (2013.01); *B64D 2203/00* (2013.01); *F21W 2107/30* (2018.01); *F21Y 2115/10* (2016.08)

(58) Field of Classification Search
CPC ..... B64D 47/02; B64D 2203/00; H01L 33/60; B60Q 3/40; F21K 9/68; F21W 2107/30; F21Y 2115/10
See application file for complete search history.

(56) References Cited

U.S. PATENT DOCUMENTS

| | | | |
|---|---|---|---|
| 6,364,506 B1 | 4/2002 | Gallo | |
| 6,945,672 B2 | 9/2005 | Du et al. | |
| 8,096,670 B2 * | 1/2012 | Trott | ......................... F21S 8/02 |
| | | | 362/147 |
| 8,403,533 B1 | 3/2013 | Paulsel | |
| 8,807,803 B2 | 8/2014 | Fabbri et al. | |
| 8,820,962 B2 | 9/2014 | Kang | |
| 9,644,819 B1 | 5/2017 | Maresh | |
| 2002/0027782 A1 * | 3/2002 | Schrewe | ................... F21S 8/02 |
| | | | 362/470 |
| 2005/0094401 A1 | 5/2005 | Magarill | |

(Continued)

FOREIGN PATENT DOCUMENTS

EP 1918204 A1 * 10/2007 ............. B64D 47/04

*Primary Examiner* — Sharon E Payne
(74) *Attorney, Agent, or Firm* — Lorenz & Kopf, LLP

(57) ABSTRACT

A lighting device for a vehicle. The lighting device includes an LED having a central axis. light distribution of light emitted by the LED is substantially symmetric about the central axis. The lighting device also includes a reflector for reflecting at least a portion of the emitted light. The reflector is positioned relative to the LED such that a combined light distribution of the emitted light and reflected light is not symmetric about the central axis and a maximum light intensity direction of the combined light distribution of the emitted light and the reflected light is angled with respect to the central axis. The position of the reflector relative to the light-emitting semiconductor device is adjustable such that an adjustment to the position of the reflector changes a direction of the maximum light intensity direction of the combined light distribution.

11 Claims, 7 Drawing Sheets

(56) References Cited

U.S. PATENT DOCUMENTS

2006/0284203 A1 12/2006 Han et al.
2010/0301353 A1 12/2010 Pabst et al.
2015/0036368 A1* 2/2015 Rittner .................. B64D 47/02
                                                              362/471

* cited by examiner

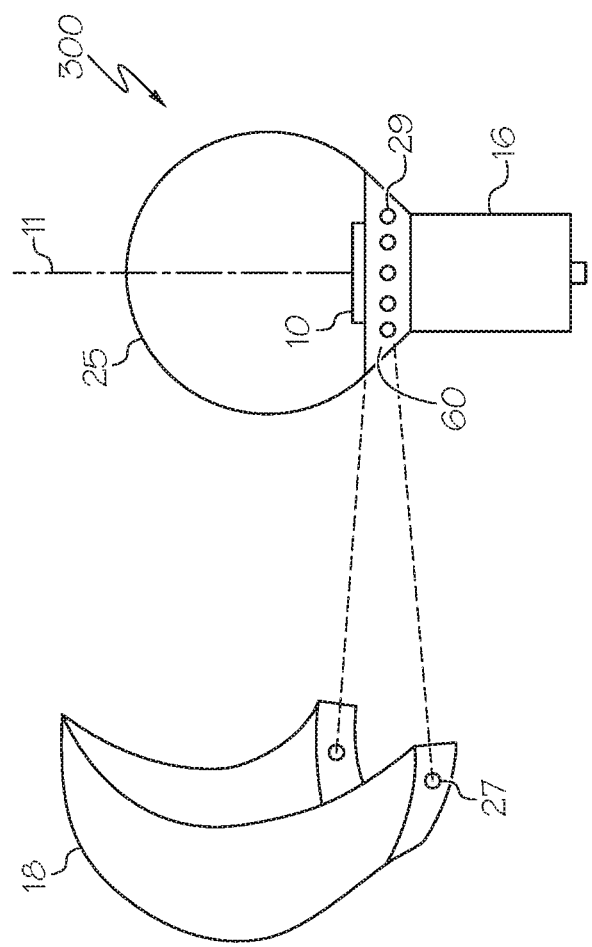
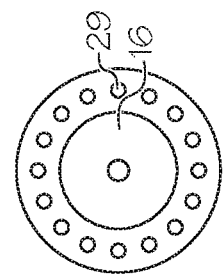
FIG. 6A
FIG. 6B

LED LIGHTING DEVICES WITH HIGH EXTRACTION EFFICIENCIES

TECHNICAL FIELD

The present disclosure generally relates to lighting devices, and more specifically relates to lighting devices for vehicles such as aircraft.

BACKGROUND

Vehicle lighting devices, such as lighting devices for aircraft, are known. Lighting devices are generally required on aircraft for use as landing lights, taxi lights, search lights, and so on. These lighting devices are used, for example, to provide better illumination during low-light conditions.

Presently, most vehicle lighting devices incorporate incandescent bulbs. Incandescent bulbs are generally less reliable and less power-efficient than LED-based lighting solutions. Although some LED-based lighting solutions exist, it is desirable to improve the efficiency and adaptability of these existing solutions.

BRIEF SUMMARY

This summary is provided to introduce a selection of concepts in a simplified form that are further described below in the detailed description section. This summary is not intended to identify key features or essential features of the claimed subject matter, nor is it intended to be used as an aid in determining the scope of the claimed subject matter.

In an exemplary embodiment, there is provided a lighting device for a vehicle. The lighting device includes a light-emitting semiconductor device having a central axis. The light-emitting semiconductor device is mounted on a base. A light distribution of light emitted by the light-emitting semiconductor device is substantially symmetric about the central axis and a maximum light intensity direction of the emitted light is substantially parallel to and coincident with the central axis. The lighting device also includes a reflector for reflecting at least a portion of the emitted light. The reflector is positioned relative to the light-emitting semiconductor device such that a combined light distribution of the emitted light and reflected light is not symmetric about the central axis and a maximum light intensity direction of the combined light distribution of the emitted light and the reflected light is angled with respect to the central axis. The position of the reflector relative to the light-emitting semiconductor device is adjustable such that an adjustment to the position of the reflector changes a direction of the maximum light intensity direction of the combined light distribution of the emitted light and the reflected light.

In an exemplary embodiment, there is provided a system comprising a light housing and a lighting device for installation into the light housing. The lighting device includes a base comprising a connector and a light-emitting semiconductor device mounted on the base. The light-emitting semi-conductor device has a central axis. A light distribution of light emitted by the light-emitting semiconductor device is substantially symmetric about the central axis and a maximum light intensity direction of the emitted light is substantially parallel to and coincident with the central axis. The lighting device further includes a reflector for reflecting at least a portion of the emitted light. The reflector is positioned relative to the light-emitting semiconductor device such that a combined light distribution of the emitted light and reflected light is not symmetric about the central axis and a maximum light intensity direction of the combined light distribution of the emitted light and the reflected light is angled with respect to the central axis. The position of the reflector relative to the light-emitting semiconductor device is adjustable such that an adjustment to the position of the reflector changes a direction of the maximum light intensity direction of the combined light distribution of the emitted light and the reflected light. The light housing includes at least one wall and an opening. The light housing also includes a fitting configured to connect with the connector of the lighting device. When the connector is connected with the fitting, the central axis of the light-emitting semi-conductor device is directed toward the at least one wall of the light housing and the maximum light intensity direction of the combined light distribution of the emitted light and the reflected light is directed toward the opening.

In an exemplary embodiment, there is provided a method of installing a lighting device into a light housing. The lighting device includes a base with a connector and a light-emitting semiconductor device mounted on the base. The light-emitting semi-conductor device has a central axis. A light distribution of light emitted by the light-emitting semiconductor device is substantially symmetric about the central axis and a maximum light intensity direction of the emitted light is substantially parallel to and coincident with the central axis. The method includes connecting the connector to a fitting of the light housing such that the central axis of the light-emitting semiconductor device is directed toward at least one wall of the light housing. The method further includes selecting a position for a reflector to reflect a portion of the light emitted by the light-emitting semiconductor device such that a combined light distribution of the emitted light and the reflected light is not symmetric about the central axis and a maximum light intensity direction of the combined light distribution of the emitted light and the reflected light is direct toward an opening of the light housing. The method further includes attaching the reflector to the lighting device in the selected position.

Other desirable features will become apparent from the following detailed description and the appended claims, taken in conjunction with the accompanying drawings and this background.

BRIEF DESCRIPTION OF THE DRAWINGS

A more complete understanding of the subject matter may be derived from the following detailed description taken in conjunction with the accompanying drawings, wherein like reference numerals denote like elements, and wherein:

FIG. 6A shows a side view of another schematic of a lighting device according to an embodiment of the present disclosure;

FIG. 6B shows a bottom view of the another schematic of a lighting device according to an embodiment of the present disclosure and FIG. 7 shows an exemplary method according to an embodiment of the present disclosure.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the systems and methods defined by the claims. Furthermore, there is no intention to be bound by any expressed or implied theory presented in the preceding Technical Field, Background, Brief Summary or the following Detailed Description.

For the sake of brevity, conventional techniques and components may not be described in detail herein. Furthermore, any connecting lines shown in the various figures contained herein are intended to represent example functional relationships and/or physical couplings between the various elements. It should be noted that many alternative or additional functional relationships or physical connections may be present in an embodiment of the present disclosure.

Figure 1:
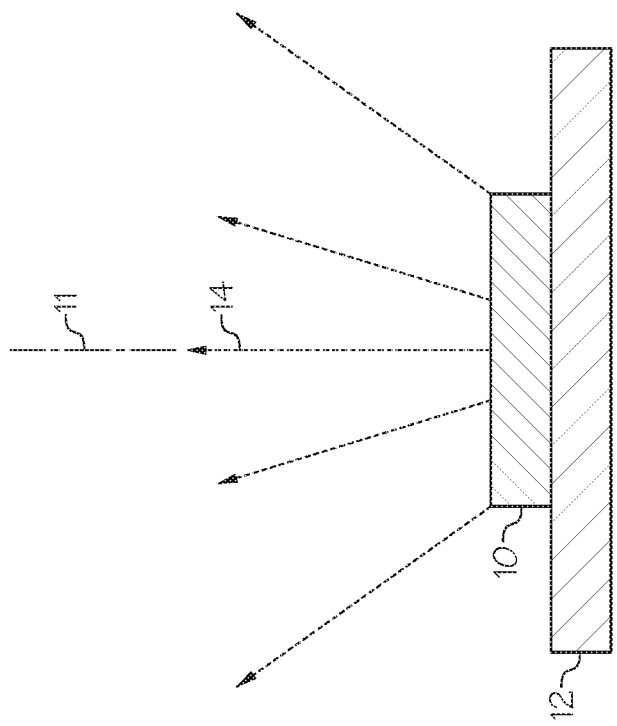
FIG. 1 is a comparison of the light emission distributions of an LED and an incandescent lighting filament.

FIG. 1 shows two different types of lighting elements. In particular, FIG. 1 shows a light-emitting semiconductor device 10 and an incandescent lighting filament 20. As will be explained below, different types of light-emitting semiconductor devices may be incorporated into lighting devices. One example of a light-emitting semiconductor device is an LED, and the following explanation will refer to LEDs in particular by way of example only. The LED 10 is shown mounted on a substrate 12.

As shown in FIG. 1, the LED 10 mounted on the substrate 12 comprises a maximum emitted light intensity direction 14 that is perpendicular to the plane of the LED 10 and is parallel to and co-incident with a central axis 11 of the LED 10. The emitted light distribution (represented by dashed arrows) of the LED 10 is limited to directions on one side of the substrate 12. In other words, the direction of light emitted by the LED is limited to an angle of 90° away from the maximum emitted light intensity direction 14. In contrast, the light emitted from the filament 20 has no inherent directionality. In other words, there is no maximum emitted light intensity direction for the light emitted from the filament 20.

Figure 2:
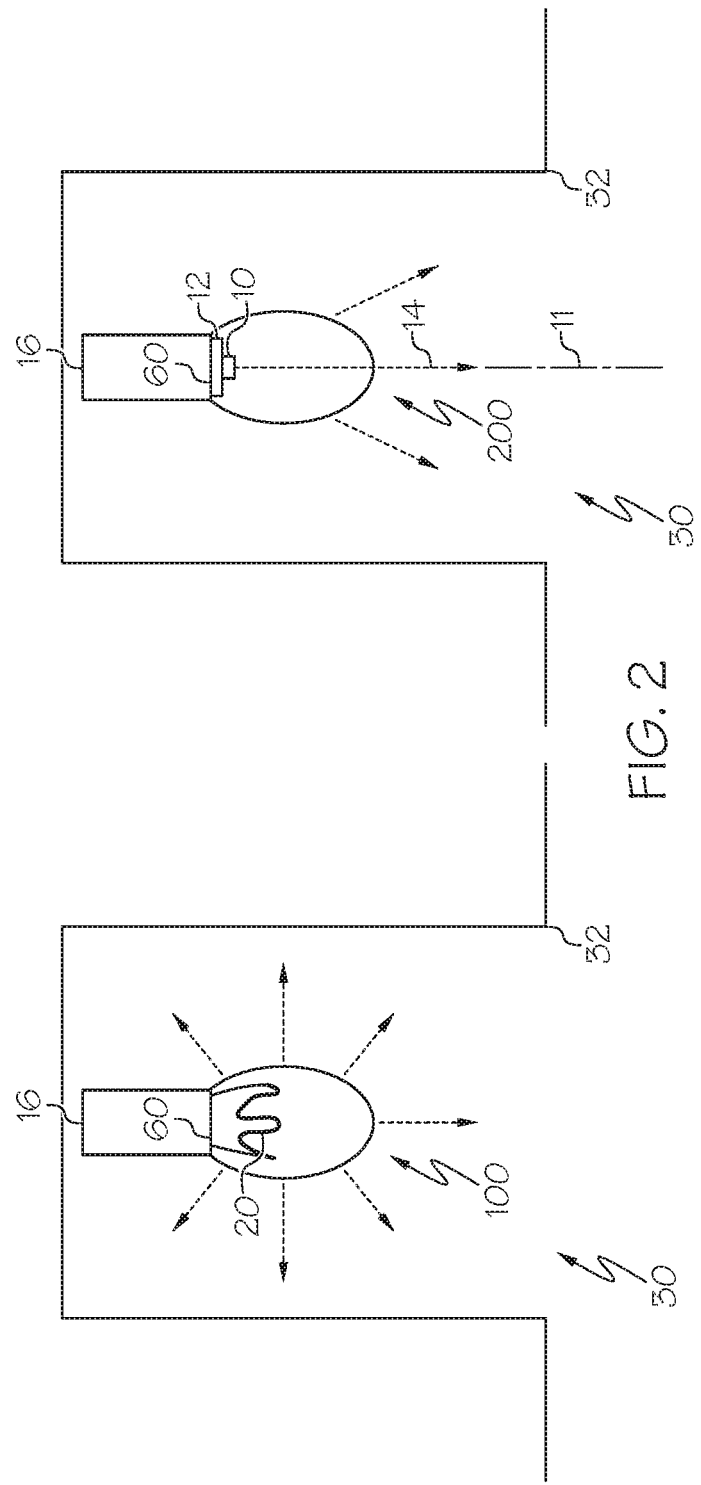
FIG. 2 is a comparison of the light distributions of a conventional filament lighting device incorporated into a luminaire housing and a conventional LED lighting device mounted into a luminaire housing.

Turning to FIG. 2, a lighting device 100 comprising an incandescent lighting filament 20 and a lighting device 200 comprising an LED light source 10 mounted on a substrate 12 are shown. Each of the incandescent lighting filament 20 and the LED light source 10 are mounted, directly or indirectly, to a base 60 of the respective lighting devices 100, 200. In particular, in the lighting device 200, the LED is mounted to a substrate 12 and the substrate is mounted on a base 60 of the lighting device 200. Both of the lighting devices 100, 200 are mounted in respective recessed light housings 30. The walls of each one of the light housings 30 form an opening 32. Each one of the lighting device 100 and lighting device 200 shown in FIG. 2 also includes a connector 16 for connecting the light source into a fitting (not shown) of the housing 30. The connector 16 is, for example, a screw-type connector, a bayonet-type connector, or another type of connector that may fixedly secure the lighting device within the housing 30. Preferably, the connectors 16 also electrically connects each lighting device to a power source (not shown) so as to provide power to the respective lighting elements 10, 20 of the lighting devices 100, 200. In an embodiment, the recessed luminaire housing 30 forms part of a vehicle, for example an aircraft.

As shown in FIG. 2, walls of each recessed luminaire housing 30 surround and partially enclose the lighting devices 100, 200. Each housing 30 also comprises an opening 32. Each one of the lighting devices 100, 200 is configured to emit light through the opening 32. In the lighting device 200, the emitted light distribution is substantially symmetric about a maximum emitted light intensity direction 14 that is parallel to and co-incident with a central axis 11 of the LED 10. The direction of the maximum intensity of emitted light 14 of the LED 10 is arranged to be directed toward the opening 32, for example perpendicular to the plane of the opening 32. In the lighting device 100, there is no maximum emitted light intensity direction, since there is no inherent directionality associated with the light produced by an incandescent filament.

As can be seen in FIG. 2, the lighting device 100 comprising an incandescent filament 20 is less efficient at emitting light through the opening 32 as compared to the lighting device 200 comprising an LED 10. In other words, if the LED 10 and the filament 20 were to produce the same amount of light, the lighting device 200 comprising the LED 10 would emit more light through the opening 32 because of the inherent directionality of the light produced by the LED 10. In contrast, since there is no inherent directionality in the light produced by the filament 20, relatively less light is emitted through the opening 32, and relatively more light is incident on and absorbed by the walls of the housing 30. As such, in housings 30 where the direction of the maximum intensity of emitted light 14 of the LED 10 is directed toward an opening 32 of the housing 30, it is generally preferable to use a lighting device 200 comprising an LED 10 as compared to a lighting device 100 comprising a filament 20. This is because the lighting device 200 comprising an LED 10 will emit relatively more light through the opening 32 as compared to the lighting device 100 comprising a filament 20, for the reasons explained above.

It is to be noted that for different types of housings 30, the fittings 40 of these housings 30 into which the lighting device 200 is to be introduced may be located in different positions within the housings 30. It is not always possible to position the fitting 40 as desired. For example, space or thermal management constraints may require a fitting to be located in the position shown in FIG. 3.

Figure 3:
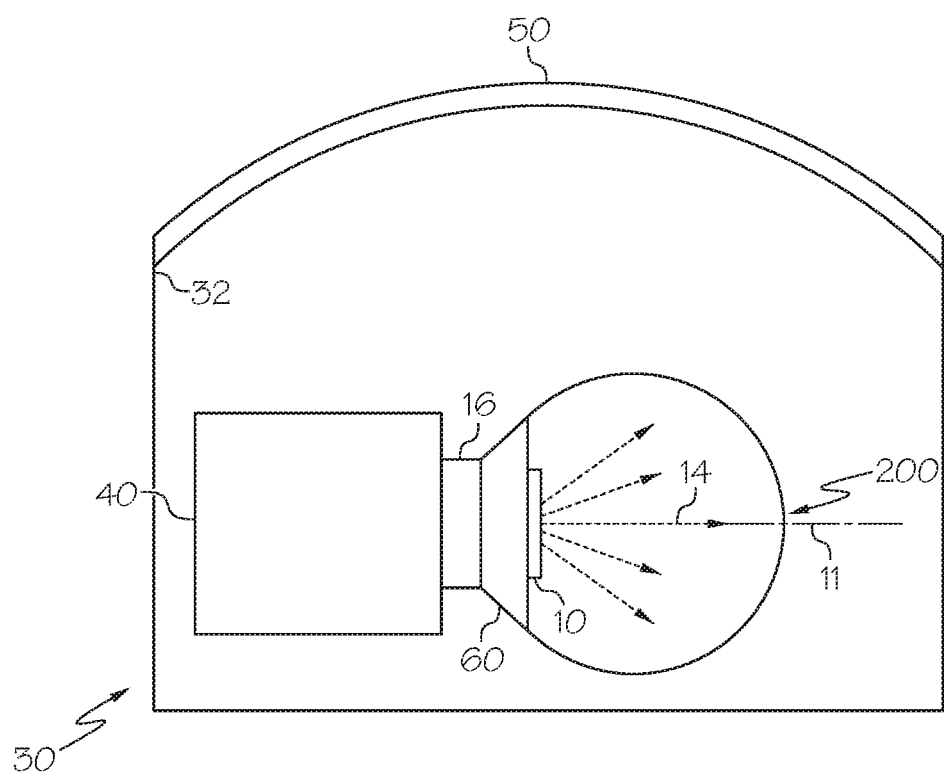
FIG. 3 shows a conventional LED lighting device mounted into a different type of luminaire housing.

In FIG. 3, a lighting device 200 comprising an LED 10 is shown incorporated into another type of recessed luminaire housing 30, in which the fitting 40 is positioned at an angle relative to the opening 32 of the housing 30. The LED 10 is mounted on a base 60 of the lighting device 200. The base 60 includes a connector 16, which is shown connected to the fitting 40 so as to secure the lighting device 200 in a fixed position. The recessed housing 30 includes a window 50 covering the opening 32. The window 50 is transparent or translucent so as to allow a portion of the light emitted by the LED 10 of the lighting device 200 to pass through the window 50. The window 50 may be formed with a rigid material such as plastic and may be provided in an arch to provide structural rigidity.

As can be seen in FIG. 3, the fitting 40 is positioned such that central axis 11 and the direction of the maximum intensity of emitted light 14 of the LED 10 cannot be directed toward the opening 32 of the housing 30 when the connector 16 of the lighting device 200 is connected to the fitting 40. As such, a relatively large proportion of light emitted by the LED 10 is incident on and absorbed by the walls of the housing 30. The ratio of the amount of light produced by the LED 10 to the amount of light emitted through the opening 32 of the housing 30 is therefore disadvantageously decreased as compared to a situation where the direction of the maximum intensity of emitted light 14 of the LED 10 is directed toward the opening 32 (as shown in FIG. 2, for example).

Figure 4:
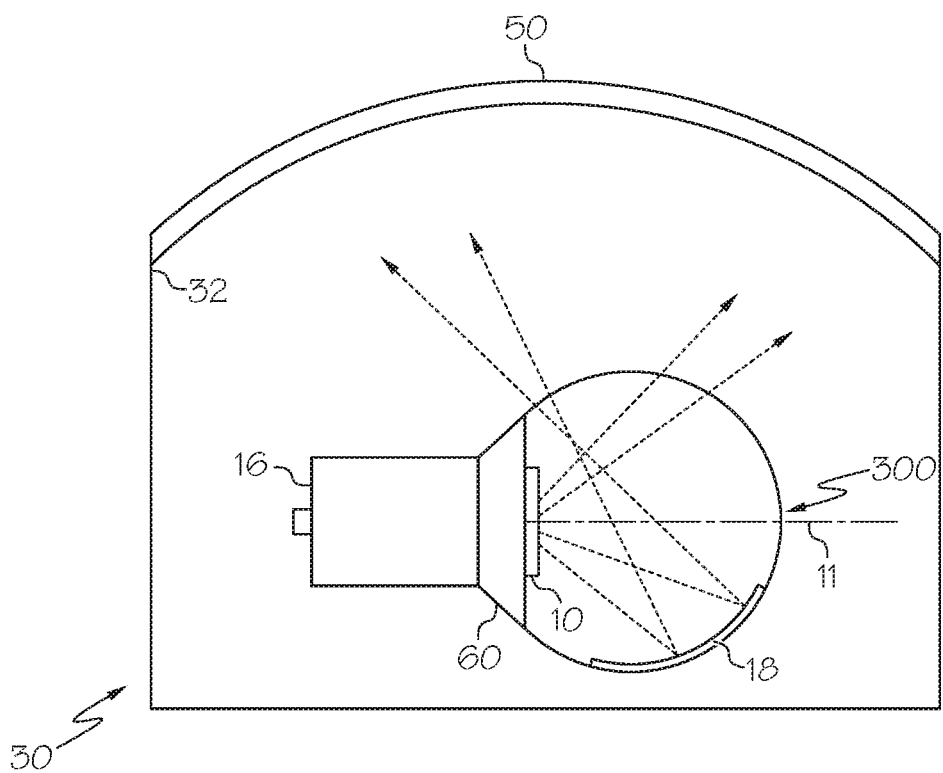
FIG. 4 shows a schematic of a lighting device according to an embodiment of the present disclosure.

In order to compensate for this decrease in the light emitted out of the opening 32, embodiments of the present invention provide a rotatable reflector. Specifically, a lighting device 300 according to an exemplary embodiment is shown in FIG. 4. In FIG. 4, the light housing 30 corresponds to the light housing 30 shown in FIG. 3. The fitting 40 is not shown in FIG. 4. The lighting device 300 of FIG. 4 includes a light-emitting semi-conductor device having a central axis 11. In the exemplary embodiment of FIG. 4, the light-emitting semi-conductor device is an LED. As explained above, various different types of light-emitting semiconductor devices may be included in the lighting device 300. In an alternative embodiment, the lighting device may include a different type of light-emitting semi-conductor device, such as an OLED. In embodiments, the lighting device of FIG. 4 includes multiple light-emitting semiconductor devices, for example an array of LEDs, with multiple central axes. In another embodiment, the light-emitting semiconductor device may be a square LED or a rectangular LED. In another embodiment, the light-emitting semiconductor device may be a circular LED, or an LED with another shape. In the exemplary embodiment of FIG. 4, the LED 10 is shown mounted directly to a base 60 of the light source 200. In other embodiments, the LED 10 may be mounted indirectly to the base 60, for example via a substrate (not shown).

As can be seen in FIG. 4, the lighting device 300 includes a rotatable reflector 18. The rotatable reflector 18 is positioned so as to reflect a portion of the light emitted by the LED 10. In particular, the rotatable reflector 18 is positioned relative to the LED 10 such that a combined light distribution of both the light emitted by the LED 10 that is reflected by the reflector 18 and the light emitted by the LED 10 which is not reflected by the reflector 18 is not symmetric about the central axis 11 of the LED 10. Furthermore, the direction of the maximum intensity of emitted light of the combined light distribution of the emitted light and the reflected light is angled with respect to the central axis 11 of the LED 10, such that the maximum light intensity direction of the combined light distribution is directed toward the opening 32.

By providing such a rotatable reflector 18, the ratio of light produced by the LED 10 to the light emitted through the opening 32 of the housing 30 may be advantageously increased as compared to lighting device 200. As such, the "extraction efficiency" of the lighting device is improved.

It is also to be noted that due to the type of connection formed between certain types of fittings 40 and certain types of connectors 16, the lighting device 300 generally cannot be rotated within the recessed housing 30 when the connector 16 is connected to the fitting 40.

In order to maintain the improved ratio of the light produced by the LED to the light emitted through the opening 32 resulting from the use of the reflector 18 across different types of housings 30, the reflector 18 is configured to be arrangeable in different angular positions about the central axis of the LED 10. In other words, the position of the reflector 18 is adjustable with respect to the position of the LED 10, for example rotatable about a central axis (not shown) of the lighting device 300. In an embodiment, the reflector 18 is detachable from the lighting device 300. In this embodiment, the reflector 18 may be detached from the lighting device when the lighting device 300 is to be installed in a housing where the fitting of that housing is positioned such that the direction of maximum intensity of emitted light is directed toward the opening of the housing when the lighting device 300 is connected to the fitting.

Figure 5:
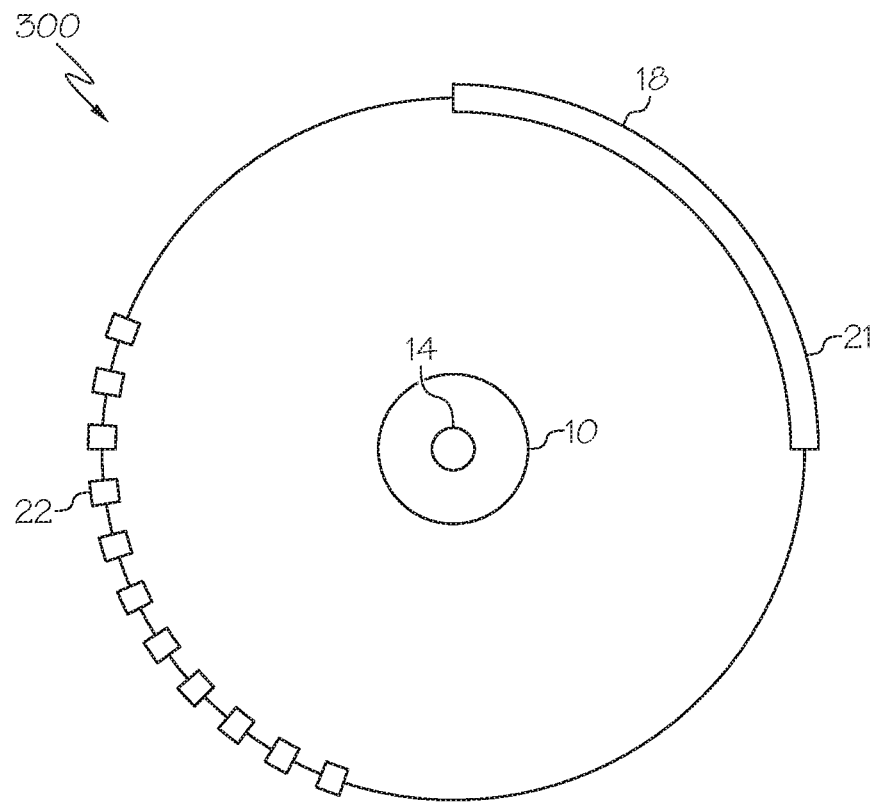
FIG. 5 shows a top-down view of a lighting device according to an embodiment of the present disclosure.

An example of how the position of the reflector 18 can be adjusted is shown in FIG. 5. In particular, in this figure, a top-down view of a lighting device 300 according to an embodiment is shown. The lighting device 300 includes an light-emitting semiconductor device, such as an LED 10. In the embodiment shown in FIG. 5, the LED 10 is arranged centrally in the lighting device 300 such that the central axis 11 of the LED 10 lies co-incident with and parallel to a central axis (not shown) of the lighting device 300. In an alternative embodiment, the LED 10 may be positioned off-axis to the central axis (not shown) of the lighting device 300.

The lighting device 300 shown in FIG. 5 includes a rotatable reflector 18. The rotatable reflector 18 is positioned and secured at a first angular position 21 with respect to the central axis 11 of the LED 10. The rotatable reflector may be re-positioned and re-secured at a different angular position with respect to the central axis 14 of the LED 10. For example, the rotatable reflector 18 may be re-positioned and secured at a second, different angular position 22 with respect to the central axis 14 of the LED 10 (which is shown in FIG. 5 with a dashed line corresponding to the position of the rotatable reflector 18 at that angular position).

By re-positioning the rotatable reflector 18 at different angular positions around the central axis 14, it is possible to re-direct the maximum light intensity direction of the combined light distribution of emitted light and reflected light. In particular, by adjusting the position of the reflector 18 relative to the position of the LED 10, the maximum light intensity direction of the combined light distribution can be chosen so as to be directed toward the opening 32 of different types of housings 30. In other words, even if the shape of the housing 30 or the position of the fitting 40 inside the housing 30 causes the maximum light intensity direction 14 of the light emitted from the LED 10 to be incident on a wall of the housing, the position of the rotatable reflector 18 can be adjusted relative to the LED 10 to a new position where the direction of the maximum light intensity direction of the light emitted from the LED and the light reflected from the rotatable reflector 18 will be toward the opening 32 of the housing 30.

Referring now to FIG. 6A, a schematic of an exemplary embodiment of the lighting device 300 is shown. In the embodiment of FIG. 6A, the reflector 18 is shaped to correspond to the shape of a transparent or translucent cover 25 of the lighting device 300. The reflector includes screw-holes 27. The lighting device 300 is configured to connect with a fitting (not shown) via a connector 16. As can be seen from the side view of FIG. 6A and the bottom view of FIG. 6B of the lighting device 300, a series of screw-holes 29 are disposed radially about the base 60 of the lighting device 300. The reflector 18 is attachable to the lighting device 300 by screwing screws through the respective screw-holes 27 and 29.

By choosing different screw-holes 29 on the base 60 to attach to the screw-holes 27 of the reflector 18, different angular positions of the rotatable reflector 18 about the central axis of the lighting device 300 can be chosen.

In other embodiments, the reflector 18 may be positioned with respect to the central axis 11 of the LED 10 through another attachment mechanism. For example, in one embodiment, the reflector 18 comprises a clamp that is configured to releasably attach the reflector 18 in different positions with respect to the LED 10. Other releasable mechanisms to connect the rotatable reflector at different positions relative to the LED 10 are envisaged, such as through the use of compression screws, through the use of a press-fit engagement, etc. In another embodiment, the reflector 18 comprises a protrusion that is slidably encapsulated within a radial groove formed about a circumference of the connector 16. In this embodiment, the angular position of the reflector 18 can be adjusted relative to the LED 10 of the lighting device 300 by sliding the reflector 18 about a circumference of the connector 16, with the groove acting as a guide for the sliding movement.

Figure 7:
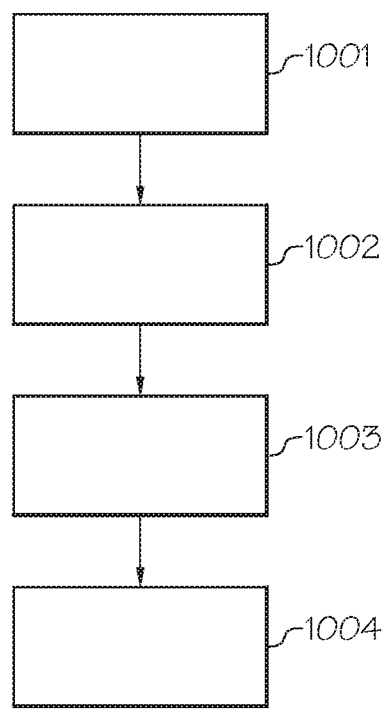

A method for of installing a lighting device according to embodiments of the present disclosure into a light housing is shown in FIG. 7. In step 1001, the lighting device is installed in the light housing by connecting a connector of the lighting device to a fitting of the light housing. When the connector is connected to the fitting, a central axis of the light-emitting semiconductor device is directed toward a wall of the light housing In step 1002, a position is selected for the reflector to reflect a portion of the light emitted by the light-emitting semiconductor device such that a combined light distribution of the emitted light and the reflected light is not symmetric about the central axis and a maximum light intensity direction of the combined light distribution of the emitted light and the reflected light is direct toward an opening of the light housing. In step 1003, the reflector is attached to the lighting device in the selected position. In an optional step 1004, the reflector may be released from the lighting device. Releasing the reflector may be desired when the LED of the lighting device fails, and it is desired to re-use the reflector with a new lighting device.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A lighting device for installation into a light housing, the lighting device comprising:
    a base;
    a light-emitting semiconductor device mounted on the base, the light-emitting semi-conductor device having a central optical axis, wherein a light distribution of light emitted by the light-emitting semiconductor device is substantially symmetric about the central optical axis of the semi-conductor device and a maximum light intensity direction of the emitted light is substantially parallel to and coincident with the central optical axis of the semi-conductor device;
    a reflector for reflecting at least a portion of the emitted light, wherein the reflector is positioned relative to the light-emitting semiconductor device such that a combined light distribution of the emitted light and reflected light is not symmetric about the central optical axis of the semi-conductor device and a maximum light intensity direction of the combined light distribution of the emitted light and the reflected light is angled with respect to the central optical axis of the semi-conductor device, and wherein a position of the reflector relative to the light-emitting semiconductor device is adjustable such that an adjustment to the position of the reflector changes a direction of the maximum light intensity direction of the combined light distribution of the emitted light and the reflected light with respect to the central optical axis of the semi-conductor device; and
    a cover disposed between the reflector and the light-emitting semi-conductor device, wherein the reflector has a corresponding shape to the cover and wherein the reflector is releasably attached to the lighting device and is configured to be releasably attachable to the lighting device at different angular positions about the central optical axis of the semi-conductor device so as to re-direct the direction of the maximum light intensity direction of the combined light distribution of the emitted light and the reflected light with respect to the central optical axis of the semi-conductor device.

2. The lighting device of claim 1, wherein the base comprises a connector configured to mechanically connect the lighting device into a fitting of the light housing.

3. The lighting device of claim 1, wherein the reflector comprises at least one screw hole, the at least one screw hole being positioned such that the reflector may be releasably attached to the lighting device via a screw.

4. The lighting device of claim 1, wherein the base comprises a plurality of screw holes for receiving a portion of a screw, the plurality of screw holes being arranged radially about a circumference of the lighting device such that a screwed engagement between the at least one screw hole of the reflector and different screw holes of the plurality of screw holes fixes the position of the reflector at different radial positions about the lighting device.

5. A system comprising a light housing and a lighting device for installation into the light housing, the lighting device comprising:
    a base comprising a connector;
    a light-emitting semiconductor device mounted on the base, the light-emitting semi-conductor device having a central optical axis, wherein a light distribution of light emitted by the light-emitting semiconductor device is substantially symmetric about the central optical axis of the light-emitting semi-conductor device and a maximum light intensity direction of the emitted light is substantially parallel to and coincident with the central optical axis of the light-emitting semi-conductor device; and
    a reflector for reflecting at least a portion of the emitted light, wherein the reflector is positioned relative to the light-emitting semiconductor device such that a combined light distribution of the emitted light and reflected light is not symmetric about the central optical axis and a maximum light intensity direction of the combined light distribution of the emitted light and the reflected light is angled with respect to the central optical axis of the light-emitting semi-conductor device, and wherein a position of the reflector relative to the light-emitting semiconductor device is adjustable such that an adjustment to the position of the reflector changes a direction of the maximum light intensity direction of the combined light distribution of the emitted light and the reflected light; and a cover disposed between the reflector and the light-emitting semi-conductor device, wherein the reflector has a corresponding shape to the cover and wherein the reflector is releasably attached to the lighting device and is configured to be releasably attachable to the lighting device at different angular positions about the central optical axis of the semi-conductor device so as to re-direct the direction of the maximum light intensity direction of the combined light distribution of the emitted light and the reflected light with respect to the central optical axis of the semi-conductor device, the light housing comprising:
at least one wall;
an opening; and
a fitting configured to mechanically connect to the connector of the lighting device, wherein, when the connector is connected with the fitting, the central optical axis of the light-emitting semi-conductor device is directed toward the at least one wall of the light housing and the maximum light intensity direction of the combined light distribution of the emitted light and the reflected light is directed toward the opening.

6. The system of claim 5, wherein the reflector comprises at least one screw hole, the at least one screw hole being positioned such that the reflector may be releasably attached to the lighting device via a screw.

7. The system of claim 6, wherein the base comprises a plurality of screw holes for receiving a portion of a screw, the plurality of screw holes being arranged radially about a circumference of the lighting device such that a screwed engagement between the at least one screw hole of the reflector and different screw holes of the plurality of screw holes fixes the position of the reflector at different radial positions about the lighting device.

8. The system of claim 5, wherein the light housing is formed in a vehicle.

9. The vehicle of claim 8, wherein the vehicle is an aircraft.

10. A method of installing a lighting device into a light housing, the lighting device comprising:
a base comprising a connector; and
a light-emitting semiconductor device mounted on the base, the light-emitting semi-conductor device having a central optical axis, wherein a light distribution of light emitted by the light-emitting semiconductor device is substantially symmetric about the central optical axis and a maximum light intensity direction of the emitted light is substantially parallel to and coincident with the central optical axis of the light-emitting semiconductor device;

the method comprising:
connecting the connector to a fitting of the light housing such that the central optical axis of the light-emitting semiconductor device is directed toward at least one wall of the light housing;
selecting a position for a reflector to reflect a portion of the light emitted by the light-emitting semiconductor device such that a combined light distribution of the emitted light and the reflected light is not symmetric about the central optical axis of the light-emitting semiconductor device and a maximum light intensity direction of the combined light distribution of the emitted light and the reflected light is direct toward an opening of the light housing; and
attaching the reflector to the lighting device in the selected position, wherein the lighting device further comprises a cover disposed between the reflector and the light-emitting semi-conductor device, wherein the reflector has a corresponding shape to the cover and wherein the reflector is releasably attached to the lighting device and is configured to be releasably attachable to the lighting device at different angular positions about the central optical axis of the semi-conductor device so as to re-direct the direction of the maximum light intensity direction of the combined light distribution of the emitted light and the reflected light with respect to the central optical axis of the semi-conductor device.

11. The method of claim 10, further comprising the step of releasing the attachment of the reflector to the lighting device.

* * * * *